United States Patent [19]
Yoshida

[11] Patent Number: 5,735,993
[45] Date of Patent: Apr. 7, 1998

[54] PLASMA PROCESSING APPARATUS FOR DRY ETCHING OF SEMICONDUCTOR WAFERS

[75] Inventor: Kazuyoshi Yoshida, Tokyo, Japan

[73] Assignee: NEC Corporation, Tokyo, Japan

[21] Appl. No.: 711,442

[22] Filed: Sep. 6, 1996

[30] Foreign Application Priority Data

Sep. 28, 1995 [JP] Japan ................................. 7-251553

[51] Int. Cl.$^6$ .................................................. H01L 21/00
[52] U.S. Cl. ........................... 156/345; 438/710; 216/67
[58] Field of Search ..................... 156/345 P, 345 MG; 216/67; 438/9, 14, 710, 712; 204/298.31

[56] References Cited

U.S. PATENT DOCUMENTS

| | | | |
|---|---|---|---|
| 5,110,438 | 5/1992 | Ohmi et al. ................ | 156/345 X |
| 5,272,417 | 12/1993 | Ohmi et al. ................ | 156/345 X |

FOREIGN PATENT DOCUMENTS 6-232081  8/1994  Japan .

*Primary Examiner*—William Powell
*Attorney, Agent, or Firm*—Young & Thompson

[57] ABSTRACT

Disclosed herein is a plasma processing apparatus having a dielectric member through which electromagnetic-waves are introduced into the reaction vessel to excite a plasma therein. A metallic resistor plate 3 is buried in the dielectric member to reduce capacitive coupling components in the plasma and to function as the electromagnetic-wave transmitting and heating member. The metallic resistor plate 3 is provided with a DC power supply 5 and a current controller 7 for feeding a controlled direct current to the metallic ressitor plate so as to elevate and control the temperature of the dielectric member 2. Sputtering of the dielectric member is prevented by the reduction of the capacitive coupling component, while deposition of etching products on the dielectric is suppressed by the controlled heating of the dielectric, thereby alleviating the problem of contaminating particle generation and increasing etching condition stability.

12 Claims, 4 Drawing Sheets

5,735,993

PLASMA PROCESSING APPARATUS FOR DRY ETCHING OF SEMICONDUCTOR WAFERS

BACKGROUND OF THE INVENTION

1. Field of the Invention

The present invention relates to a plasma processing apparatus for use in fabrication of semiconductor devices and more specifically to an anisotropic dry etching apparatus using a plasma including etching species.

2. Description of the Related Art

With the increase in the miniaturization and the integration density of semiconductor devices, plasma processing apparatuses are being increasingly used as dry etching apparatuses capable of anisotropical etching of wafers. In dry etching apparatuses using plasmas, etching of a semiconductor wafer is performed through an interaction with neutral radicals and ions produced in the plasma formed inside a reaction vessel (often called the "reaction chamber"). Although the ions in the plasma can directly strike the wafers under the action of the electric field, many of them they collide with the neutral gas molecules and are scattered changing the direction of their movement. As a result, the ions fail to strike the wafer perpendicularly, and this results in side etching which causes deviation from the dimensional specification defined by an etching mask.

Therefore, it is suggested to lower the pressure inside the reaction chamber to reduce the number of neutral gas molecules to thereby decrease the chance of collision between the ions and the neutral gas molecules. This suggestion, however, creates new problems such as low etching speed and low selectivity over the underlying layer, since the density of the plasma itself decreases accordingly. For this reason, another plasma processing apparatus has been proposed which, through the use of high-density plasma sources, allows production of a plasma with sufficient density in low-pressure regions.

An example of such a plasma processing apparatus is disclosed in Japanese Unexamined Patent Application Disclosure (KOKAI), HEI 6-232081. FIG. 8 is a schematic cross-sectional view illustrative of an example of a conventional plasma processing apparatus. As shown in FIG. 8, this plasma processing apparatus is equipped with a vacuum vessel 21 which can be subjected to pressure reduction. The vacuum vessel 21 has a wall separating its interior and an exterior, and is made mostly of an electrically conductive wall material, and accommodates a lower electrode 26 on which a sample (workpiece) 27 is to be mounted, and a dielectric plate 22 which constitutes part of the wall of the vacuum vessel 21 and guides electromagnetic waves to the internal space of the vacuum vessel 21, and an antenna 23 which is placed outside the vacuum vessel, adjacent to the dielectric 22 and produces an inductive field when a high-frequency current is fed through it. The inductive field produced by the antenna 23 is guided to the internal of the vacuum vessel 21 via the dielectric 22 so as to generate plasma which is used to process the sample 27.

With plasma processing apparatuses which use such inductive coupling type plasma, the antenna 23 acts not only as a source for producing an induction field, but also as an electrode, and thus capacitive coupling components are present in the plasma due to direct coupling of the antenna 23 and the plasma in the vacuum vessel 21. Consequently, as compared with having a plasma produced only by an induction field, the potential of the surface of the dielectric 22 within the vacuum vessel 21 becomes more negative relative to the plasma potential. As a result, the positive ions in the plasm are attracted to the surface, and the surface of the dielectric 22 at the side of the vacuum vessel 21 is sputteredby these positive ions causing decomposition of the dielectric 22, increasing the risk of impurities being mixed into the plasma.

To overcome this problem, the plasma processing apparatus of the related art provides a conductive element 25, which is capable of passing through electromagnetic waves (induction field), between the antenna 23 and the dielectric 22. The conductive element 25 is electrically connected to the vacuum vessel 21 to prevent direct coupling of the antenna 23 and the plasma to thereby reduce capacitive coupling components in the plasma, thus preventing mixing of impurities into the plasma due to the sputtering of the dielectric's surface.

With the conventional plasma processing apparatus described above, a conductor capable of passing through electromagnetic waves is provided between an antenna and a dielectric, and an electrical connection between the conductor and the vacuum vessel is established to prevent contamination with impurities due to the sputtering of the dielectric. However, even with this configuration, reaction products from etching may be deposited on the inner surface of the dielectric as a deposition film. This deposition film formed on the dielectric may be peeled off at some time producing troublesome particles. In addition, prolonged continuation of the etching process may cause change in the dimension of etching on the sample, which leads to an instability problem. This is because, as the etching process time is prolonged and the number of the processed wafers increases, the temperature of the dielectric increases causing reduction in the amount of etch product deposition on the dielectric. This in turn increases the amount of etch product deposition on the to be etched sample workpiece, thus changing the resultant etching dimension and shape.

SUMMARY OF THE INVENTION

Therefore, it is an object of the present invention to provide a plasma processing apparatus which prevents deposition of etch products, etc. on the dielectric plate to alleviate the problem of producing particles and which also increases etching condition stability.

To this end, the present invention provides a plasma processing apparatus comprising: a vacuum reaction vessel which has a dielectric wall portion typically on its top with the other wall portions of the vessel electrically grounded, a flat coil placed outside the vacuum reaction vessel and near the top surface of the dielectric portion, a first high-frequency power supply for feeding a high-frequency current through the coil via a first tuning mechanism, means for guiding a plurality of processing gasses to the inside of the vacuum reaction vessel, means for controlling the pressure of the processing gases, a lower electrode placed at the lower portion of the vacuum reaction vessel to mount a sample thereon, a second high-frequency power supply for feeding a high-frequency voltage across the lower electrode via a tuning mechanism, an electromagnetic-wave transmitting and heating member which comprises a metal plate buffed in the dielectric plate and capable of passing electromagnetic waves, and which is also capable of raising the temperature of the dielectric, a DC power supply for feeding a direct current through the electromagnetic-wave transmitting and heating member via a filter for cutting off electromagnetic waves, a temperature measuring means for measuring the temperature of the dielectric portion, and a control section for controlling the current from the DC power supply based on the temperature of the dielectric measured by the temperature measuring mechanism.

Another characteristic aspect of the present invention resides in the construction of the electromagnetic-wave transmitting and heating member as a single metal insulator plate, or as two separate members segmented into a metal plate capable of transmitting electromagnetic waves and a flat resistive heating plate. Yet another characteristic aspect of the present invention is found in the formation of a plurality of electromagnetic-wave transmitting slits in the metal resistor plate or the metal plate, or in the thickness control of the plates to allow transmission of electromagnetic waves.

BRIEF DESCRIPTION OF THE DRAWINGS

The above and other objects, advantages and features of the present invention will be more apparent from the following description taken in conjunction with the accompanying drawing in which.

DESCRIPTION OF THE PREFERRED EMBODIMENTS

The present invention will now be explained with reference to the drawings.

Figure 1:
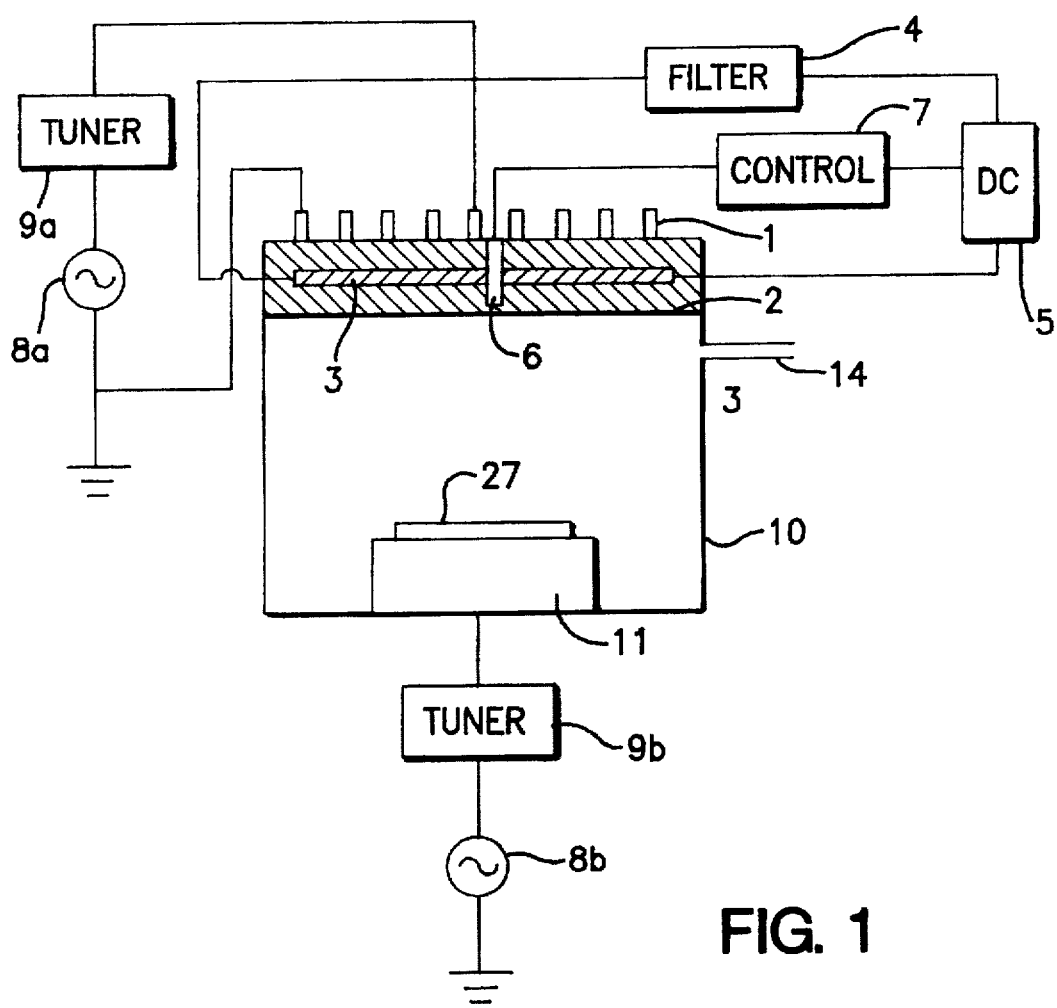
FIG. 1 is a schematic cross-sectional view illustrative of a plasma processing apparatus according to an embodiment of the present invention.

FIG. 1 is a schematic cross-sectional view illustrative of a plasma processing apparatus according to an embodiment of the present invention. As illustrated in FIG. 1, this plasma processing apparatus is equipped with a metallic resistor plate 3 buried in a dielectric plate 2 which constitutes part of a vacuum reaction vessel 10. The metallic resistor plate 3 passes through (transmits) electromagnetic-waves and also functions as a heating member. Also equipped are a DC power supply 5 for supplying a direct current to the metallic resistor plate 3 via a high-frequency cutoff filter 4; a temperature measuring element 6 for measuring the temperature of the dielectric plate 2; a current controller 7 which controls supply of the DC current based on the temperature measured by the temperature measuring element 6; and a flat spiral coil 1 which is placed on top of the exterior surface of the vacuum vessel 1 and which receives a high-frequency electric current supplied from an RF power supply 8a via a tuning mechanism 9a.

The apparatus depicted in FIG. 1 is further equipped with a lower electrode 11 with a sample 27, typically a semiconductor wafer such as silicon, mounted thereon; an RF power supply 8b which feeds a high-frequency current through the lower electrode 11 via a tuning mechanism 9b; and in the same manner as the conventional art, a processing gas inlet 14 for introducing processing gases and an exhaust apparatus for controlling the pressure of the introduced processing gases.

As is well known, a high-frequency current fed through the spiral coil 3 results in an induction field in the vacuum reaction vessel 10 via the dielectric 2, and this causes generation of a plasma. Here, since the spiral coil 1 functions as an electrode as well, the spiral coil 1 and the plasma are placed in series, thus forming a capacitor. Hence, capacitive coupling components will be present in the plasma. The metallic resistor plate 3 is placed in the dielectric portion 2 in order to reduce this capacitive coupling component. The metallic resistor plate 3 has an electromagnetic-wave transmission function (ability to let electromagnetic waves pass through) which will be described later. Without this electromagnetic-wave transmission ability, the induction field, which is produced by feeding a high-frequency current through the spiral coil 1, will be cut off, and thus no plasma will be generated.

Figure 2:
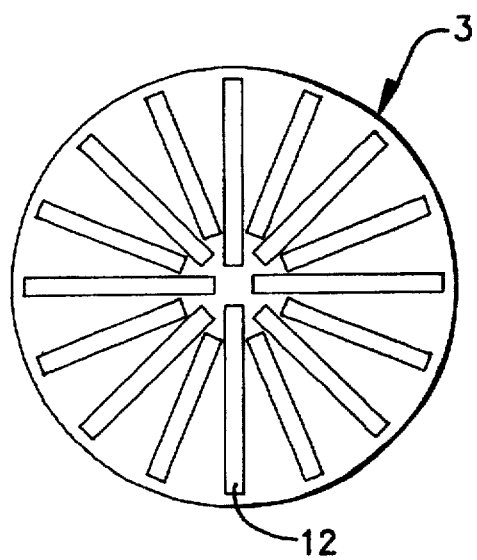
FIG. 2 is a plan view of the metal resistor plate shown in FIG. 1.

FIG. 2 is a plan view of the metallic resistor plate shown in FIG. 1. A possible configuration of the metallic resistor plate having an electromagnetic-wave transmission function is the one illustrated in FIG. 2, which includes an appropriate number of slits 12 placed at right angles to the high-frequency current flowing through the spiral coil 1 shown in FIG. 1. A filter 4 for cutting off high-frequency components in the direct current from the DC power supply 5 is also connected to the metallic resistor plate 3 buried in the dielectric plate 2. Needless to say, all the electrical connections are RF-shielded.

Further, a DC current fed through the metallic resistor plate 3 causes the metallic resistor plate 3 to function as a resistor, that is, a heating member to raise the temperature of the dielectric plate 2. Additionally, a thermometer, for example, a resistance thermometer is buried in the dielectric plate 2 as the temperature measuring element 6 for measuring the temperature of the dielectric plate 2. The measured temperature is supplied to the current controller 7 to control the current fed through the metallic resistor plate 3 and eventually the temperature of the dielectric plate 2. In other words, the controlled heating of the dielectric plate 2 allows reduction in the amount of etch product deposits on the dielectric plate 2, and further prevents fluctuation of the sticking coefficient of the deposits. As a result, the decrease in the amount of deposits alleviates the problem of the particles, while the stabilization of the sticking coefficient of the deposits serves to increase the stability of the etching condition.

Figure 3:
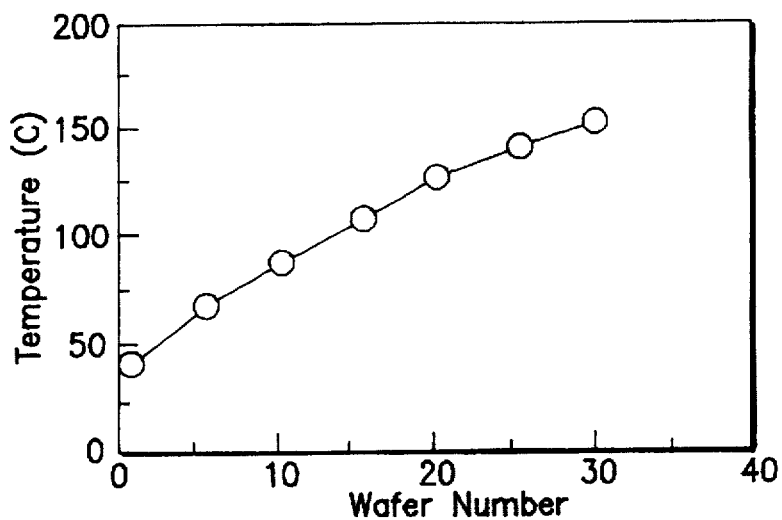
FIG. 3 is a graph showing the relationship between the number of processed wafers and the temperature of the dielectric in cases where no heating mechanism is provided.

FIG. 3 is a graph showing the relationship between the number of processed wafers and the temperature of the dielectric plate 2 in cases where no heating mechanism is provided. For example, in cases where the vacuum reaction vessel 10 is controlled to a temperature of 60° C., the sample 27-mounting lower electrode 11 is controlled to a temperature of 20° C., and the dielectric plate 2 is not heated, the temperature of the dielectric plate 2 in the early stages prior to commencing etching is 40° C. When the etching process was carried out under these conditions, the sticking probability (coefficient) of the reaction products was high on the sample and low on the vacuum reaction vessel with that on the dielectric plate in the middle.

Continuance of the etching process results in increase of the temperature of the dielectric plate 2, and as shown in FIG. 3, the temperature of the dielectric plate 2 rises to 150° C. after thirty wafers have undergone etching for an etching time of 90 seconds per wafer.

Figure 4:
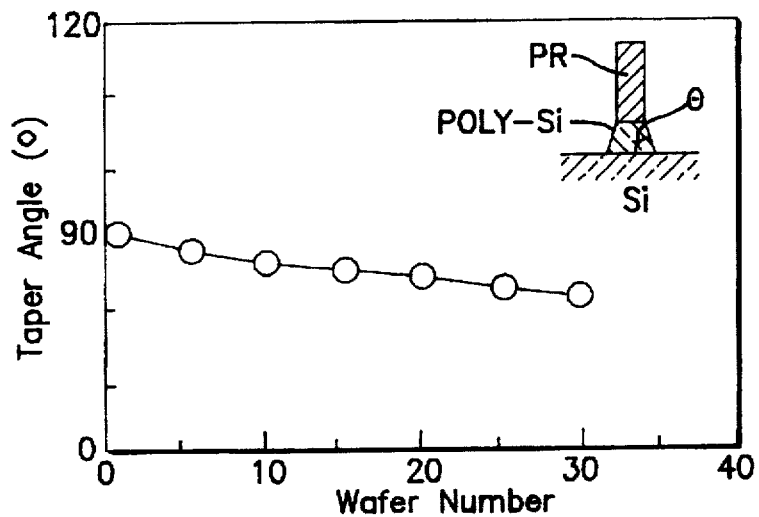
FIG. 4 is a graph showing the relationship between the number of processed wafers and changes in the taper angle θ of a polysilicon layer due to etching in cases where no heating mechanism is provided.

FIG. 4 is a graph showing the relationship between the number of processed wafers and changes in the taper angle θ of a polysilicon layer due to etching in cases where no heating mechanism is provided. Since the temperature of the dielectric plate increases as the number of the processed wafers increases, the sticking probability of reaction products changes so that the probability on the sample still being the highest, that on the the vacuum reaction vessel exceeds that on the dielectric plate. Thus, the deposit originally deposited on the dielectric plate 2 is eventually deposited on the sample 27, thus increasing the amount of deposition on the sample 27. When the etching process is continued under these conditions, the taper angle θ of the etched geometry gradually decreases as shown in FIG. 4, and this presents an etching instability problem.

Figure 5:
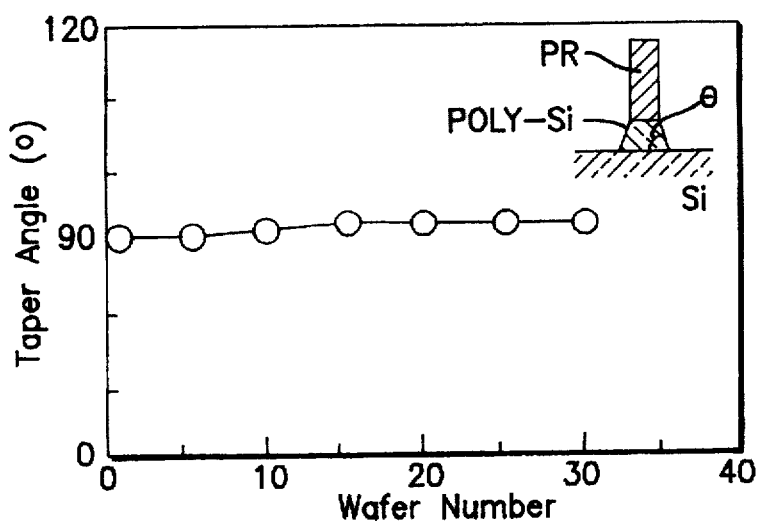
FIG. 5 is a graph showing the relationship between the number of processed wafers and changes in the taper angle q of a polysilicon layer due to etching in cases where a heating mechanism is provided.

FIG. 5 is a graph showing the relationship between the number of processed wafers and changes in the taper angle θ of a polysilicon layer etching in cases where a heating mechanism is provided. As long as the temperature of the dielectric plate 2 is controlled to a constant temperature of 150° C. from the early stages by the heating mechanism, continued etching of wafers does not cause change in the 90° "taper" angle of the etched geometry, as shown in FIG. 5, and thus no problem of etching instability is presented.

As an example, when approximately 1,000 wafers were processed without heating the dielectric plate 2, 100 or more particles having particle sizes of 0.2 μm or more were produced. This results in lower production yields. In addition, after continuous etching of approximately 30 polysilicon layers, the dimensional change due to etching was found to be ±10% or more relative to the photoresist width of 0.25 μm. This is believed to seriously influence the characteristics of the devices.

In contrast, heating and temperature control of the dielectric plate 2 resulted in only about 20 particles having particle sizes of 0.2 μm or more, even after 1,000 pieces were processed; this is believed to allow setting of a wet vessel cleaning cycle of 2,000 pieces or more. Also, the dimensional deviation after the continuous process was kept within ±10%.

Figure 6:
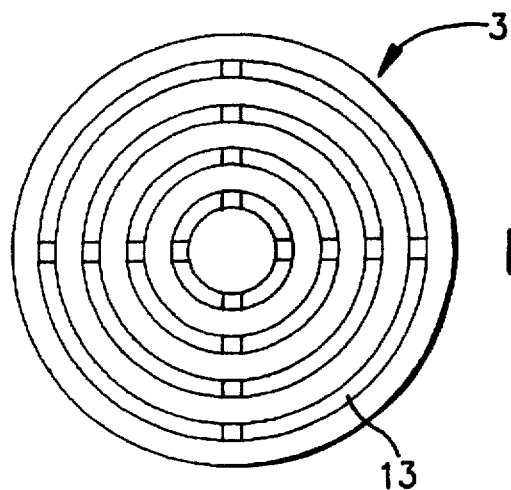
FIG. 6 is a plan view illustrative of a modification of the metal resistor plate shown in FIG. 1.

According to the foregoing embodiment, the electromagnetic-wave transmission function of the metallic resistor plate 3 was provided by radial slits 12. In a second embodiment, the same may be accomplished by providing concentric slits 13, as shown in FIG. 6, which is a plan view illustrative of a modification of the metallic resistor plate shown in FIG. 1. The electro-magnetic-wave transmission function may also be supplied by thinning the metallic resistor plate 3.

Figure 7:
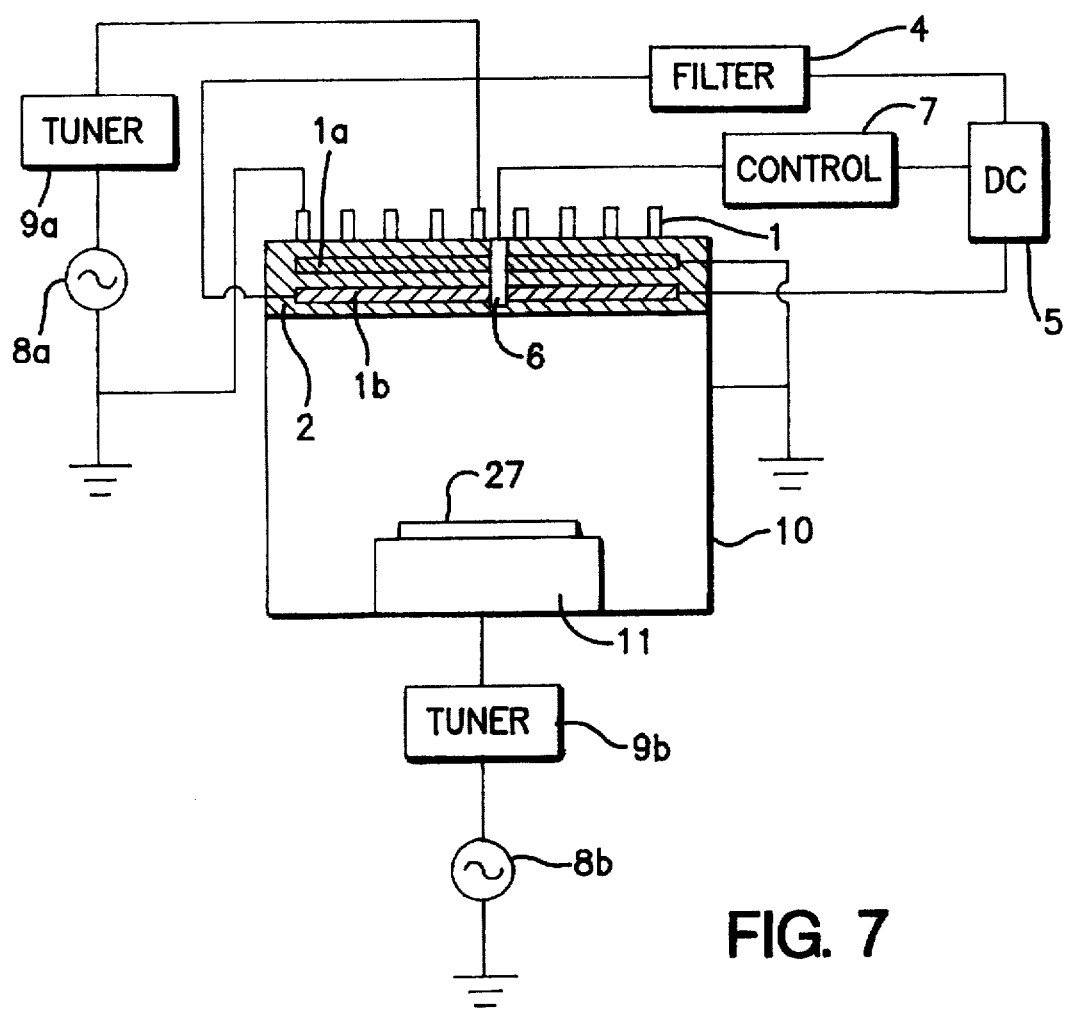
FIG. 7 is a schematic cross-sectional view illustrative of a plasma processing apparatus according to another embodiment of the present invention.
Figure 8:
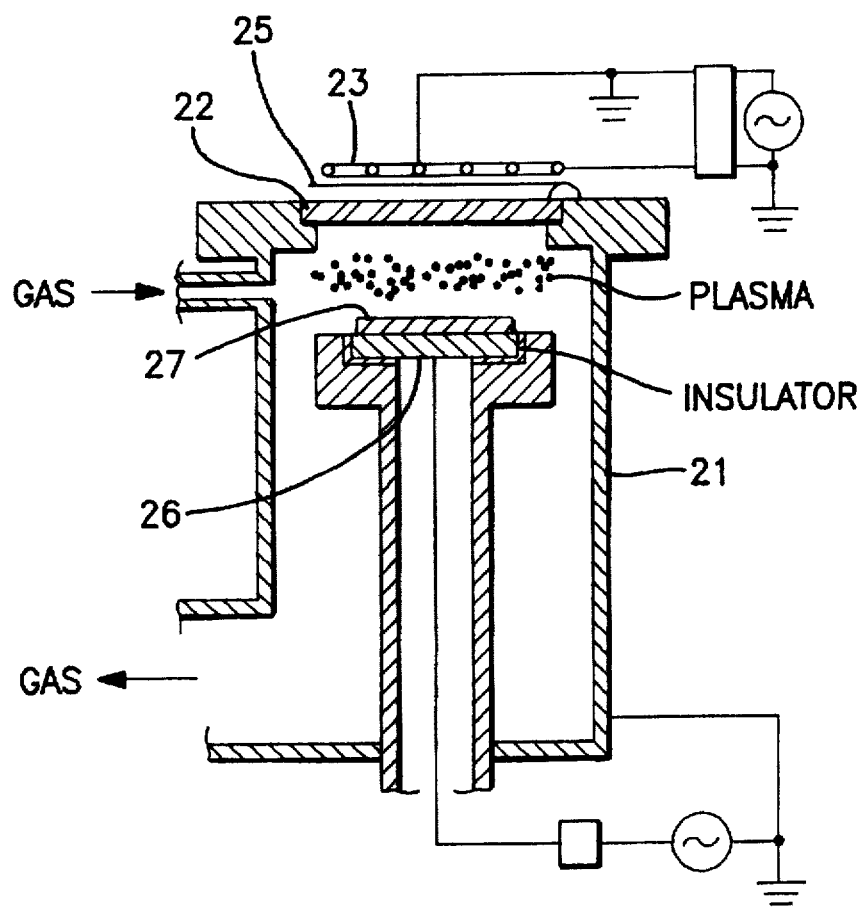
FIG. 8 is a schematic cross-sectional view illustrative of an example of a conventional plasma processing apparatus.

FIG. 7 is a schematic cross-sectional view illustrative of a plasma processing apparatus according to another embodiment of the present invention. Unlike the embodiments described above where the metallic resistor plate 3 shown in FIG. 1 serves both to reduce the capacitive coupling components in the plasma and to heat the dielectric portion 2, the plasma processing apparatus, as shown in FIG. 7, has a metallic plate 1a having an electromagnetic-wave transmission function and a heater 1b for raising the temperature of the dielectric portion 2. They are separately buried in the dielectric 2 in order to lower the capacitive coupling components. The present embodiment is otherwise identical to the ones described above.

The metallic plate 1a has slits 12 or 13 as illustrated in FIG. 2 or FIG. 6, and is electrically connected to the vacuum reaction vessel 10 as an electric ground. The heater 1b is of the same geometry as the metal plate 1a, and is connected to the DC power supply section 5 via the filter 4 which cuts off high-frequency waves. The connections, including wiring connections to the heater 1b, are of course RF-shielded. A controller 7 is also provided which turns on and off current fed through heater 1b based on the temperature of the dielectric portion 2.

This configuration allows both reduction of the capacitive coupling components in the plasma and control of the temperature of the dielectric portion 2 as well. As a result, the problem of particles and etching instability is alleviated. Furthermore, with the plasma processing apparatus according to the present embodiment, since the tabular heater for controlling the temperature of the dielectric 2 is separated from the metal plate for reducing the capacitive coupling components, the apparatus has the advantage of allowing greater flexibility in the selection of heater materials, and is much easier to use than the above-described plasma processing apparatus equipped with the integral metallic resistor plate.

As described above, the present invention produces an effect which solves the problem of contaminant particle impurities by provision of a plasma processing apparatus which is designed to feed a high-frequency current through a flat coil to cause electromagnetic induction, thereby producing an induction field, and to guide the induction field to the interior of a vacuum reaction vessel via a dielectric member to produce plasma in the vacuum reaction vessel, wherein a heating member for raising the temperature of the dielectric, and a member which reduces capacitive coupling components in the plasma and has an electromagnetic-wave transmission function are buried in the dielectric, and the temperature of the dielectric are properly controlled. Thus, while preventing direct coupling of the coil and the plasma to reduce sputtering of the dielectric, deposition of the reaction products resulting from etching, etc. onto the dielectric is reduced.

In addition, controlling the dielectric to a constant elevated temperature produces the effect of preventing variation in the sticking probability of reaction product deposits on the dielectric and accordingly prevents fluctuations in film thickness of the deposit, thus ensuring stable etching at all times.

While the present invention has been described in connection with certain preferred embodiments, it is to be understood that the subject matter encompassed by way of the present invention is not to be limited to those specific embodiments. On the contrary it is intended for the subject mattter of the invention to include all alternatives, modifications and equivalents as can be included within the spirit and scope of the following claims.

What is claimed is:

1. A plasma processing apparatus comprising:

a vacuum reaction vessel having a wall separating an interior of said vacuum reaction chamber from an exterior, said wall having a dielectric portion and an electrically grounded conductive portion;

a flat electrical coil placed adjacent to said dielectric portion outside said vacuum reaction vessel;

a first high-frequency power supply for feeding a high-frequency current to said coil via a first tuning mechanism;

means for supplying a plurality of processing gasses to said interior of said vacuum reaction vessel;

a lower electrode disposed in said interior of said vacuum reaction vessel to face said dielectric portion and capable of mounting a sample to be processed thereon;

a second high-frequency power supply for feeding a high-frequency voltage to said lower electrode via a tuning mechanism;

an electromagnetic-wave transmitting heating member having a metal plate buried within said dielectric portion and capable of transmitting electromagnetic waves, and also capable of raising the temperature of said dielectric portion;

a DC power supply for feeding a direct current to the electromagnetic-wave transmitting heating member via a filter capable of cutting off electromagnetic waves;

a temperature measuring means for measuring the temperature of said dielectric portion; and a controller for controlling the current supplied from said DC power supply to said electromagnetic-wave transmitting heating member on the basis of said temperature measured by said temperature measuring means.

2. The plasma processing apparatus as claimed in claim 1, wherein said electromagnetic-wave transmitting heating member is a metallic resistor plate.

3. The plasma processing apparatus as claimed in claim 1, wherein said electromagnetic-wave transmitting heating member comprises a metal plate capable of transmitting electromagnetic waves and a heating plate.

4. The plasma processing apparatus as claimed in claim 2, wherein a plurality of electromagnetic-wave transmitting slits are formed in said metallic resistor plate.

5. The plasma processing apparatus as claimed in claim 2, wherein a plurality of electromagnetic-wave transmitting slits are formed in said metallic resistor plate, said slits being aligned in a radial manner.

6. The plasma processing apparatus as claimed in claim 2, wherein a plurality of electromagnetic-wave transmitting slits are formed in said metallic resistor plate, said slits being aligned in a concentric manner.

7. The plasma processing apparatus as claimed in claim 3, wherein a plurality of electromagnetic-wave transmitting slits are formed in at least one of said metallic resistor plate and said metal plate.

8. The plasma processing apparatus as claimed in claim 3, wherein a plurality of electromagnetic-wave transmitting slits are formed in at least one of said metallic resistor plate and said metal plate, said slits being aligned in a radial manner.

9. The plasma processing apparatus as claimed in claim 3, wherein a plurality of electromagnetic-wave transmitting slits are formed in at least one of said metallic resistor plate and said metal plate, said slits being aligned in a concentric manner.

10. The plasma processing apparatus as claimed in claim 2, wherein said metallic resistor plate has a thicknesses which allows transmission of electromagnetic waves.

11. The plasma processing apparatus as claimed in claim 3, wherein at least one of said metallic resistor plate and said metal plate have thicknesses which allow transmission of electromagnetic waves.

12. The plasma processing apparatus as claimed in claim 1, wherein said flat electrical coil is a spiral coil.

* * * * *